United States Patent [19]

Yokoyama

[11] 4,015,214
[45] Mar. 29, 1977

[54] PUSH-PULL AMPLIFIER
[75] Inventor: Kenji Yokoyama, Hamamatsu, Japan
[73] Assignee: Nippon Gakki Seizo Kabushiki Kaisha, Hamamatsu, Japan
[22] Filed: Apr. 3, 1975
[21] Appl. No.: 564,751
[30] Foreign Application Priority Data
  Apr. 9, 1974   Japan ............... 49-40297
  Apr. 30, 1974  Japan ............... 49-49860
  Apr. 9, 1974   Japan ............... 49-40298
[52] U.S. Cl. ................ 330/13; 330/15; 330/30 D; 330/35
[51] Int. Cl.² .................... H03F 3/185
[58] Field of Search ........... 330/13, 30 D, 15, 35; 307/304

[56] References Cited
UNITED STATES PATENTS 3,516,003  6/1970   Boone .................. 330/18 X
3,746,893  7/1973   DeBretagne ............ 307/304
3,862,367  1/1975   Kono et al. ........... 330/13 X
3,927,333  12/1975  Furuhashi ............. 330/13 X

OTHER PUBLICATIONS

Danilovie et al., "Voltage Stabilization of the Source-Follower Operating Point," *Electronic Engineering*, Feb. 19, 1969, pp. 221–223.

*Primary Examiner*—James B. Mullins
*Attorney, Agent, or Firm*—Cushman, Darby & Cushman

[57] ABSTRACT

A push-pull transistor amplifier having a preamplification stage consisting of complementary symmetry transistors. The quiescent operating points of the transistors are stabilized by the provision of a constant-current circuitry connected between the source electrodes of both transistors.

4 Claims, 4 Drawing Figures

PUSH-PULL AMPLIFIER

BACKGROUND OF THE INVENTION a. Field of the Invention

This invention relates to electrical signal amplifying system, and more particularly to an arrangement for stabilizing the operation characteristics of a direct-coupled transistor amplifier.

b. Description of the Prior Art:

Through the use of the well known direct-coupling technique, a transistor amplifier may be constructed which eliminates the need for interstage blocking capacitors. The elimination of such coupling capacitors provides improved frequency response over a wide range. However, because of the direct-coupled circuit's ability to amplify direct-current as well as alternating-current signals, extreme care must be taken to stabilize the quiescent operating point for each transistor. Small variations in the operating point of the earlier stages may be amplified to cause profound changes in the latter stages.

SUMMARY OF THE INVENTION

It is therefore an object of the present invention to provide an improved biasing arrangement for a direct-coupled push-pull amplifier.

Another object of the present invention is to provide a push-pull amplifier with stabilized d-c bias voltage.

It is still another object of the present invention to provide a constant-current supplying circuit for supplying a stable current to the sources of complementary symmetry transistors.

DETAILED DESCRIPTION OF THE PREFERRED EMBODIMENTS

Figure 1:
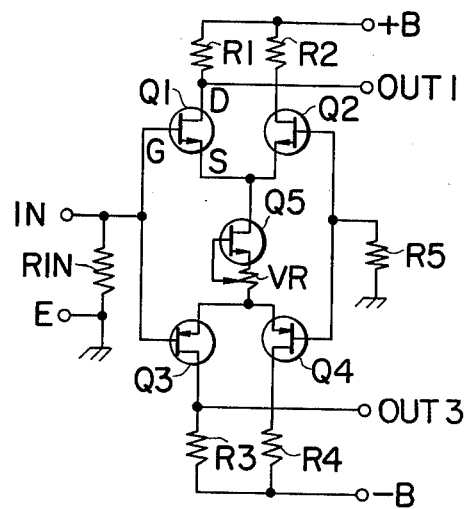
FIG. 1 shows a push-pull amplifier according to the present invention.

Referring now to the drawings, FIG. 1 shows a differential amplifier.

N-channel field effect transistors (FET) Q1 and Q2 have a common connection at their source electrodes, and their drain electrodes are connected respectively through resistors R1 and R2 to voltage supply +B. P-channel field effect transistors Q3 and Q4 have a common connection at their source electrodes, and their drain electrodes are connected respectively through resistors R3 and R4 to voltage supply −B. The gate electrodes of transistors Q1 and Q3 are connected together to input terminal IN, and those of transistors Q2 and Q4 are grounded together through a resistor R5. Another field effect transistor Q5 has a drain electrode connected to said source connection of transistors Q1 and Q2, a source electrode connected through rheostat VR1 to said source connection of transistors Q3 and Q4, and a gate connected to the sliding tap of said rheostat VR1. This field effect transistor Q5 may be substituted by a bi-polar transistor having a constant-current characteristic resembling a vacuum tube pentode. Output terminal OUT1 (OUT3) is connected to the drain of transistor Q1 (Q3). Where, the output may be taken from either or both of the drains of field effect transistors Q1 (Q3) and Q2 (Q4).

Thus, the amplifier of FIG. 1 is a push-pull amplifier provided with a first differential amplifier consisting of transistors Q1 and Q2 and a second differential amplifier consisting of transistors Q3 and Q4 connected to each other through transistor Q5 forming a constant-current flowing circuit. If rheostat VR1 is adjusted to set the drain current of transistor Q5 at a desired value, the constant circuit which is formed of the transistor Q5 is used as a source current determining circuit for transistors Q1 to Q4. Because of the existence of the constant-current circuit, the bias voltage for field effect transistors Q1 to Q4 are extremely stable. The field effect transistor Q5 with its high output impedance gives no ill effect on the a-c operation of the amplifier.

AC operation of this amplifier circuit is described as follows. A positive half signal applied to input terminal IN turns the transistor Q1 "on" and the transistor Q2 "off" to yield a negative half signal to the output terminal OUT 1. A negative half signal which is applied to the input terminal IN turns the transistor Q3 "on" and the transistor Q4 "off" to yield a positive half signal to the output terminal OUT 3.

Figure 2:
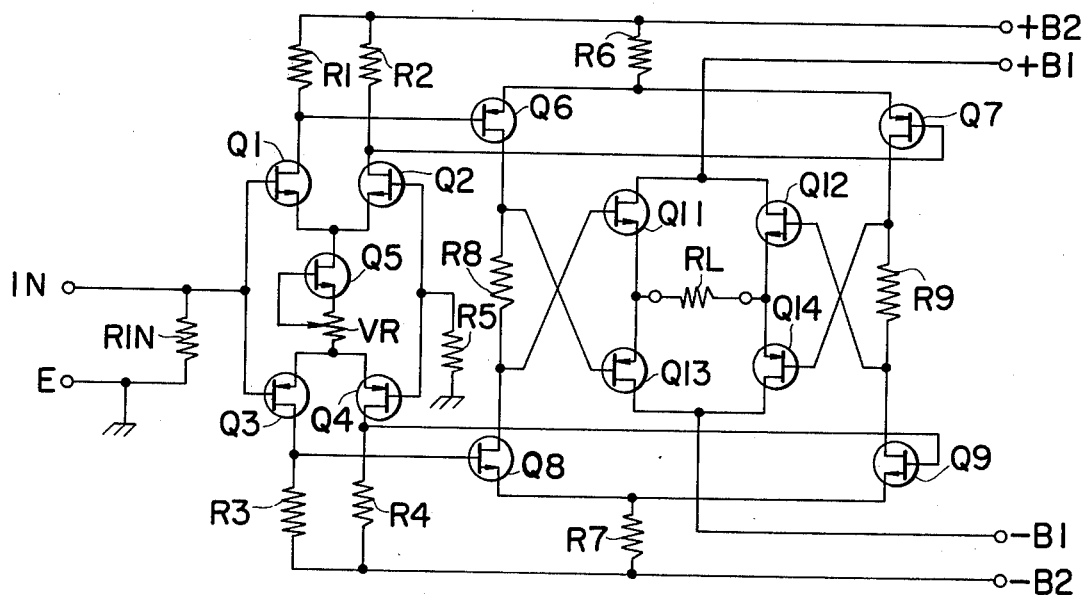
FIG. 2 shows a three-stage direct-coupled amplifier employing the amplifier of FIG. 1 in the pre-driving stage.

FIG. 2 shows an audio power amplifier utilizing the differential amplifier in the input stage. In this power amplifier, the input stage is composed of the differential push-pull amplifier illustrated in FIG. 1 and, therefore, its detailed description is omitted here.

The driver stage is composed as follows. A pair of p-channel field effect transistors (FET) Q6 and Q7 have a common connection at their source electrodes, which is connected through a resistor R6 to voltage supply +B2. A pair of n-channel field effect transistors Q8 and Q9 have a common connection at their source electrodes, which is connected through resistor R7 to voltage supply −B2. The drain of the field effect transistor Q6 is connected through a resistor R8 to the drain of transistor Q8, and that of the transistor Q7 through resistor R9 to the drain of transistor Q9. The gates of transistors Q6 and Q7 are connected respectively to the drains of transistors Q1 and Q2, and those of transistors Q8 and Q9 are connected respectively to the drains of transistors Q3 and Q4.

The final power stage is composed as follows. A pair of n-channel field effect transistors Q11 and Q12 have their drain electrodes connected together to voltage supply +B1. A pair of p-channel field effect transistors Q13 and Q14 have their drain electrodes connected together to the voltage supply −B1. The gates of the transistors Q11 and Q13 are connected in the form of X to the drains of transistors Q8 and Q6, and those of the transistors Q12 and Q14 are also connected in the form of X to the drains of the transistors Q9 and Q7 in the driver stage. The source electrodes of the transistors Q11 and Q13 are connected together to an end of a load resistor RL, and those of the transistors Q12 and Q14 to the other end of the load resistor RL.

According to this circuit configuration, the driver stage has two oppositely-phased push-pull amplifier circuits connected parallel to each other. One push-pull is composed of transistors Q6 and Q8 with their gates connected to the drains of the transistors Q1 and Q3. The other push-pull is composed of transistors Q7 and Q9 with their gates connected to the drains of transistors Q2 and Q4. In this connection, p-channel field effect transistors Q6 and Q7 and n-channel field effect transistors Q8 and Q9 are normally biased. The power amplification stage includes four transistors Q11 to Q14, which form a bridge circuit to provide a BTL amplifier circuit. The gates of p-channel field effect transistors Q13 and Q14 are connected respectively to the drains of transistors Q6 and Q7, and those of n-channel field effect transistors Q11 and Q12 are connected respectively to the drains of transistors Q8 and Q9. Thus, the gates of transistors Q11 and Q13 are linked in X form to the ends of resistor R8, and those of transistors Q12 and Q14 are likewise linked to the ends of resistor R9. Therefore, all of the transistors Q11 to Q14 are normally biased. According to this circuit configuration, it is possible to directly couple all the stages from input to power output. The final stage is easily constructed in BTL configuration.

AC operation of this amplifier circuit is the same as that of known BTL push-pull circuits.

The field effect transistors which are utilized in said circuit may be substituted by ordinary transistors.

The features of the present amplifier circuit are as follows. The field effect transistors forming differential amplifiers are supplied with a stabilized d-c bias voltages, because the constant-current circuit keeps constant the current through the transistors regardless of the variation in supply voltages. A direct-coupling permits the differential push-pull amplifier to have a wide frequency range. If the circuit of FIG. 1 is utilized in the earlier stage of an audio power amplifier (as shown in FIG. 2), d-c bias voltages in the subsequent stages are also stabilized.

Figure 3:
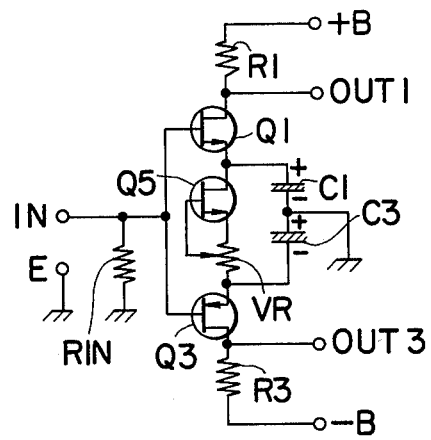
FIG. 3 shows another push-pull amplifier which embodies the principles and features of the present invention.

FIG. 3 shows another example of pre-driver stage amplifier. In this circuit, capacitors C1 and C3 replace transistors Q2 and Q4 and resistors R2, R4 and R5 in FIG. 1.

The drain of n-channel field effect transistor Q1 is connected through resistor R1 to a voltage supply +B, and that of p-channel field effect transistor Q3 is connected through resistor R3 to a voltage supply −B. The gates of the transistors Q1 and Q3 are connected together to input terminal IN. The source electrodes of the transistors Q1 and Q3 are grounded respectively through capacitors C1 and C3. A field effect transistor Q5 is connected between the source electrodes of the transistors Q1 and Q3. Where, transistors Q5 has a drain electrode connected to the source electrode of the transistor Q1, a source electrode connected through rheostat VR to the source of the transistor Q3, and a gate electrode connected to a sliding tap of said rheostat VR. The field effect transistor Q5 may be replaced by a bi-polar transistor having the characteristics of a vacuum-tube pentode. The outputs OUT 1 and OUT 3 of this circuit are taken from the drains of transistors Q1 and Q3.

Operation of this pre-driver amplifier is described as follows. A positive half of an a-c signal is applied to and phase reversed at the transistor Q1 and then it appears on the output terminal OUT 1. Similarly, a negative half of the signal is applied to and phase reversed at the transistor Q3 and then appears on the output terminal OUT 3. In other words, one transistor conducts for one half of the input signal cycle and the other conducts for the other half. These two-half cycles are then combined to form an amplified replica of the input wave form.

According to the circuit configuration of FIG. 3, the first and the second amplifiers which are composed of the transistors Q1 and Q3 are coupled to each other through a constant-current flowing circuit composed of a transistor Q5. Therefore, if the rheostat VR inserted in source circuit of the transistor Q5 is adjusted to provide a desired current, this transistor Q5 is available as a constant-current, flowing circuit for the transistors Q1 and Q3. Because of this constant-current circuit, the bias voltage for the transistors Q1 and Q3 are extremely stable. The field effect transistors Q5 with its high output impedance gives substantially no ill effect on the a-c operation of the amplifier.

Figure 4:
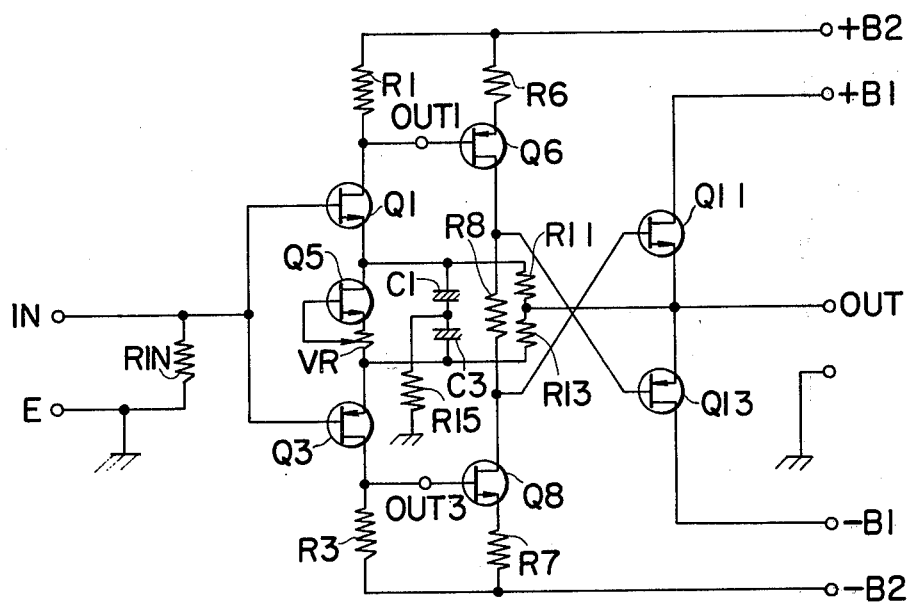
FIG. 4 shows another three-stage direct-coupled amplifier utilizing the amplifier of FIG. 3 in the predriver stage.

FIG. 4 shows an audio power amplifier employing the push-pull amplifier utilizing the circuit of FIG. 3. Wherein, the junction point of the capacitors C1 and C3 is grounded through resistor R15, and a series connection of resistors R11 and R13 is connected parallel to the capacitors C1 and C3. Transistors Q6, Q8, Q11 and Q13 form a two-stage direct-coupled amplifier. Thus, the circuit of FIG. 4 is a complementary symmetry amplifier consisting of direct-coupled three-amplification-stages. This amplifier, because its circuit configuration is symmetrical, has such advantage that wave distortion and ripple noises are cancelled each other.

I claim:

1. A push-pull amplifier comprising:
   a first amplification circuit including at least one n-channel field effect transistor and having a first output terminal connected to the drain electrode of said n-channel field effect transistor;
   a second amplification circuit including at least one p-channel field effect transistor and having a second output terminal connected to the drain electrode of said p-channel field effect transistor;
   a constant-current circuit connected in series within a single current path through which the source currents of both said n-channel and p-channel field effect transistors flow in common;
   a positive voltage supply connected to the drain current path of said n-channel field effect transistor;
   a negative voltage supply connected to the drain current path of said p-channel field effect transistor; and
   an input terminal connected to the gate electrodes of both said n-channel and p-channel field effect transistors.

2. An amplifier according to claim 1, in which:
   said first amplification circuit comprises a first and a second n-channel field effect transistor and said second amplification circuit comprises a third and a fourth p-channel transistor;
   the drains of said first and second transistors are connected through respective resistors to said positive voltage supply, and those of said third and fourth transistors are connected through respective resistors to said negative voltage supply;
   the gates of said first and third transistors are connected together to said input terminal, and those of said second and fourth transistors are grounded together through a resistor;
   said constant-current circuit consisting of a field effect transistor having a drain electrode connected to the sources of said first and second transistors, a source electrode connected through a rheostat to the sources of said third and fourth transistors, and a gate electrode connected to the sliding-tap of said rheostat.

3. An amplifier according to claim 2 employed in the pre-driver stage of a direct-coupled push-pull amplifier, wherein the amplifier further comprises:
- a driving stage including a pair of p-channel transistors and a pair of n-channel transistors, said pair of p-channel transistors having gates connected respectively to the drains of aid n-channel transistors in the pre-driver stage, sources connected together to said positive voltage supply through a resistor and drains, said pair of n-channel transistors having gates connected respectively to the drains of said p-channel transistors in the pre-driver stage, sources connected together to said negative voltage supply through another resistor and drains connected respectively through further resistors to said drains of said pair of n-channel transistors; and
- a power stage including a pair of p-channel transistors with their gates linked with the drains of the p-channel transistors in the driving stage, drains connected directly to another negative voltage supply, a pair of n-channel transistors with their gates linked with the drains of the n-channel transistors in the driving stage, drains connected directly to another positive voltage supply, the source of one of the p-channel transistors being connected to the source of one of the n-channel transistors and the source of the other of the p-channel transistors being connected to the source of the other of the n-channel transistors, and a load connected between the junctions of different typed transistors' sources.

4. An amplifier according to claim 1, wherein
said first amplification circuit comprises an n-channel transistor having a drain connected through a resistor to said positive voltage supply, a gate connected to said input terminal, and a source grounded through a capacitor;

said second amplification circuit comprises a p-channel transistor having a drain connected through another resistor to said negative voltage supply, a gate connected to the input terminal, and a source grounded through another capacitor; and said constant-current circuit comprises a field effect transistor with its drain connected to the source of said n-channel field effect transistor, itssource connected through a rheostat to the source of said p-channel field effect transistor, and its gate connected to the sliding-tap of said rheostat.

* * * * *